United States Patent
Frankowsky

(10) Patent No.: US 6,697,291 B2
(45) Date of Patent: Feb. 24, 2004

(54) METHOD FOR CHECKING A CONDUCTIVE CONNECTION BETWEEN CONTACT POINTS

(75) Inventor: Gerd Frankowsky, Höhenkirchen (DE)

(73) Assignee: Infineon Technologies AG, Munich (DE)

(*) Notice: Subject to any disclaimer, the term of this patent is extended or adjusted under 35 U.S.C. 154(b) by 25 days.

(21) Appl. No.: 10/185,629

(22) Filed: Jun. 28, 2002

(65) Prior Publication Data
US 2003/0002369 A1 Jan. 2, 2003

(30) Foreign Application Priority Data
Jun. 28, 2001 (DE) .......................... 101 31 386

(51) Int. Cl.[7] ............................... G11C 7/00
(52) U.S. Cl. ........................ 365/201; 702/89
(58) Field of Search .................. 365/201; 702/89, 702/119, 85; 324/158.1

(56) References Cited

U.S. PATENT DOCUMENTS

| | | | |
|---|---|---|---|
| 5,315,553 A | | 5/1994 | Morris |
| 5,726,920 A | * | 3/1998 | Chen et al. .............. 702/108 |
| 5,956,280 A | | 9/1999 | Lawrence ............... 365/201 |
| 6,622,103 B1 | * | 9/2003 | Miller ..................... 702/89 |

* cited by examiner

*Primary Examiner*—Vu A. Le
(74) *Attorney, Agent, or Firm*—Laurence A. Greenberg; Werner H. Stemer; Gregory L. Mayback

(57) ABSTRACT

In order to test, in parallel, semiconductor chips formed on a wafer, functionally identical contact points of the semiconductor chips are connected to column lines, and the rows of the semiconductor chips are selected by selection signal lines. This method is suitable in particular for checking electrically conductive connections between contact points of the semiconductor chips and mating contacts of a test head.

8 Claims, 7 Drawing Sheets

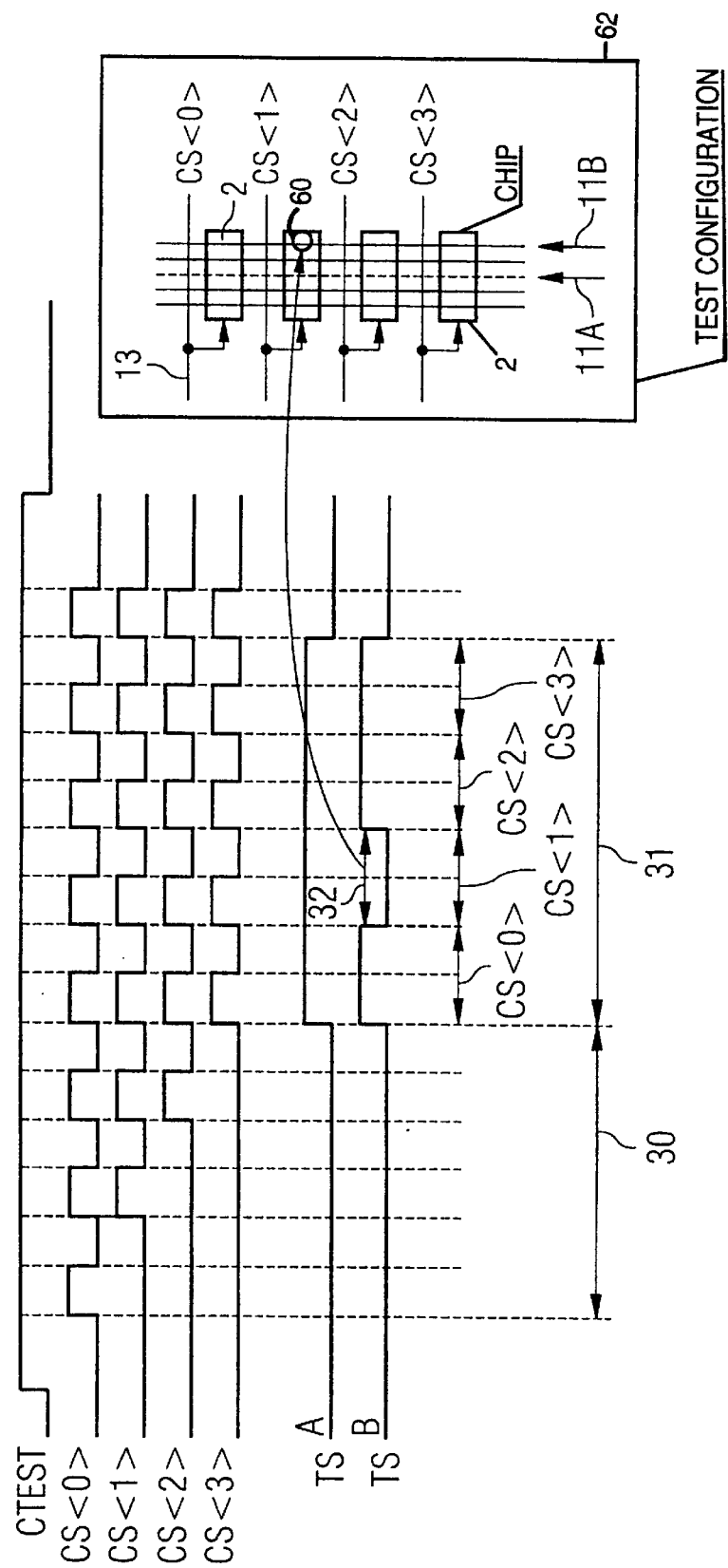

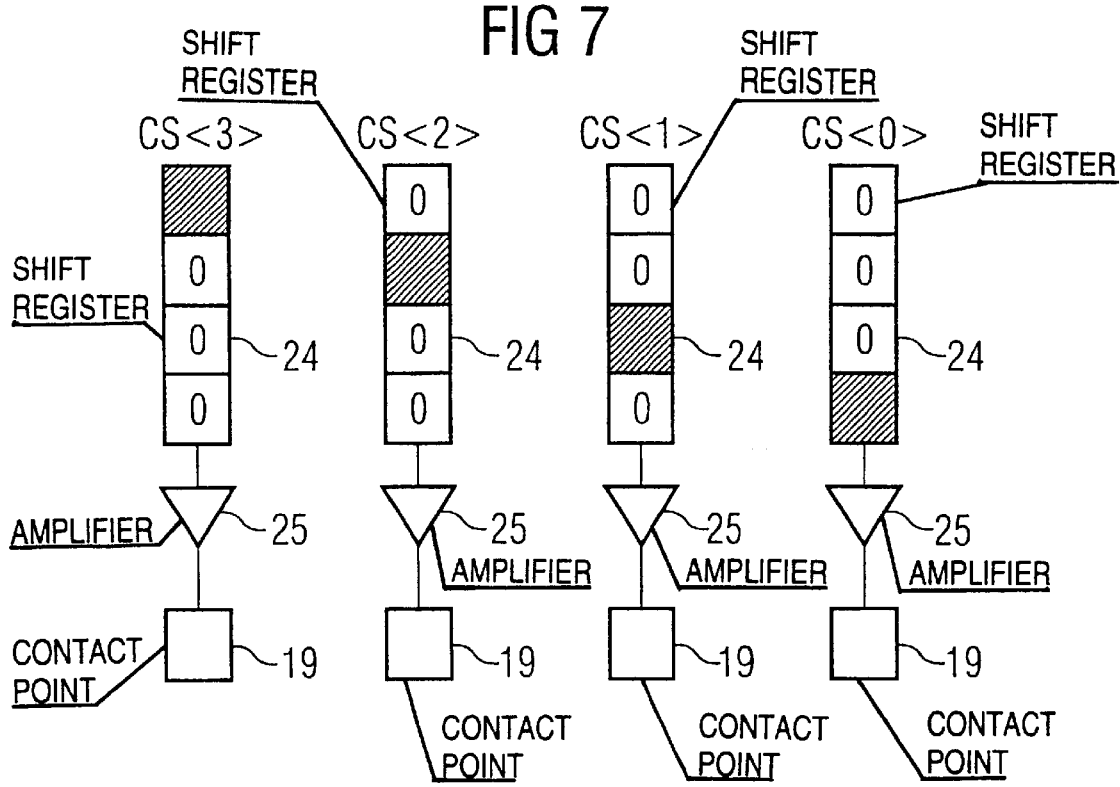
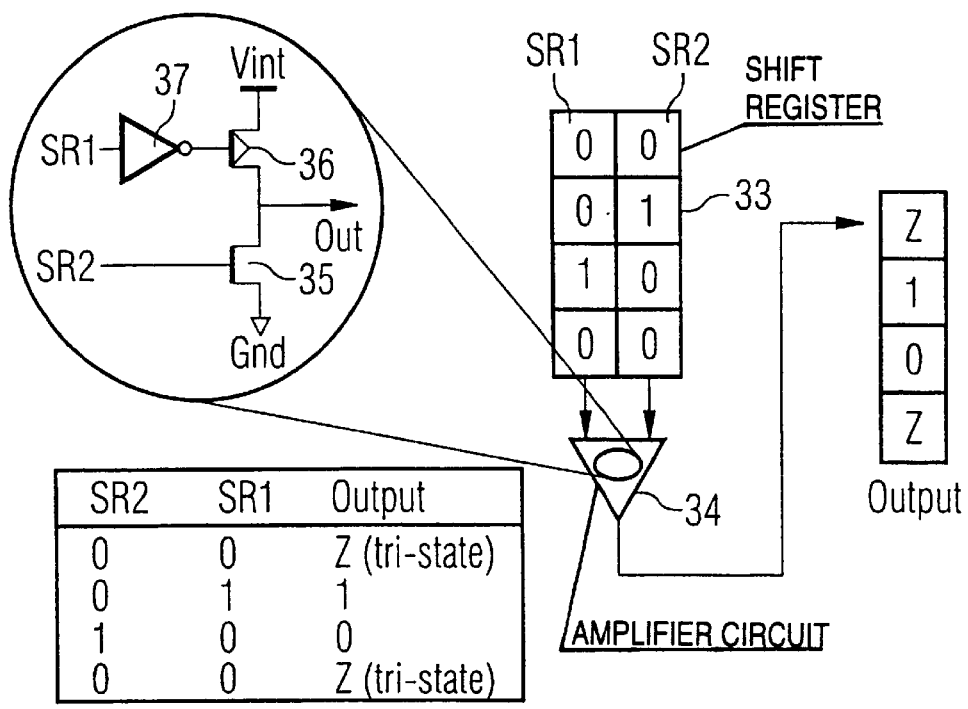

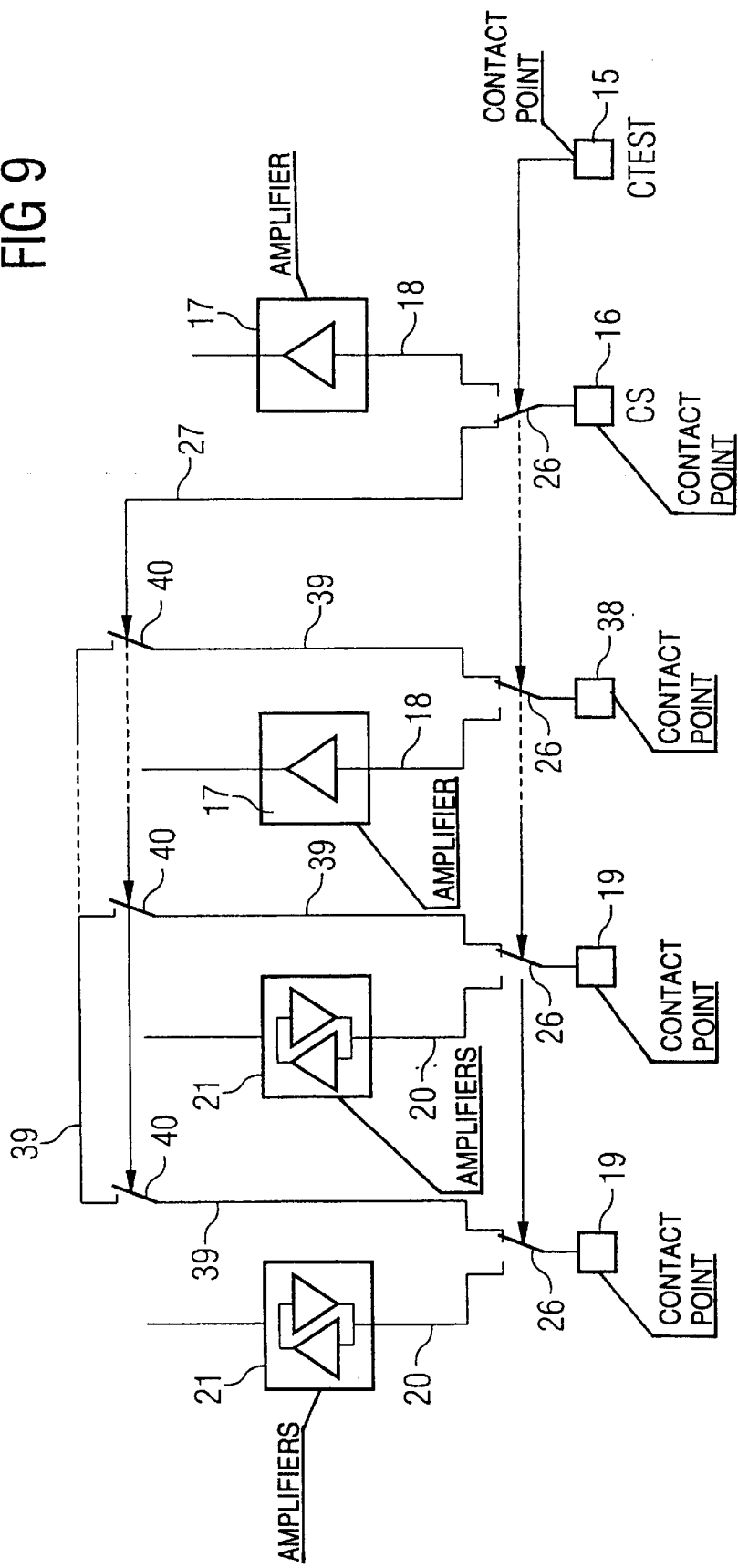

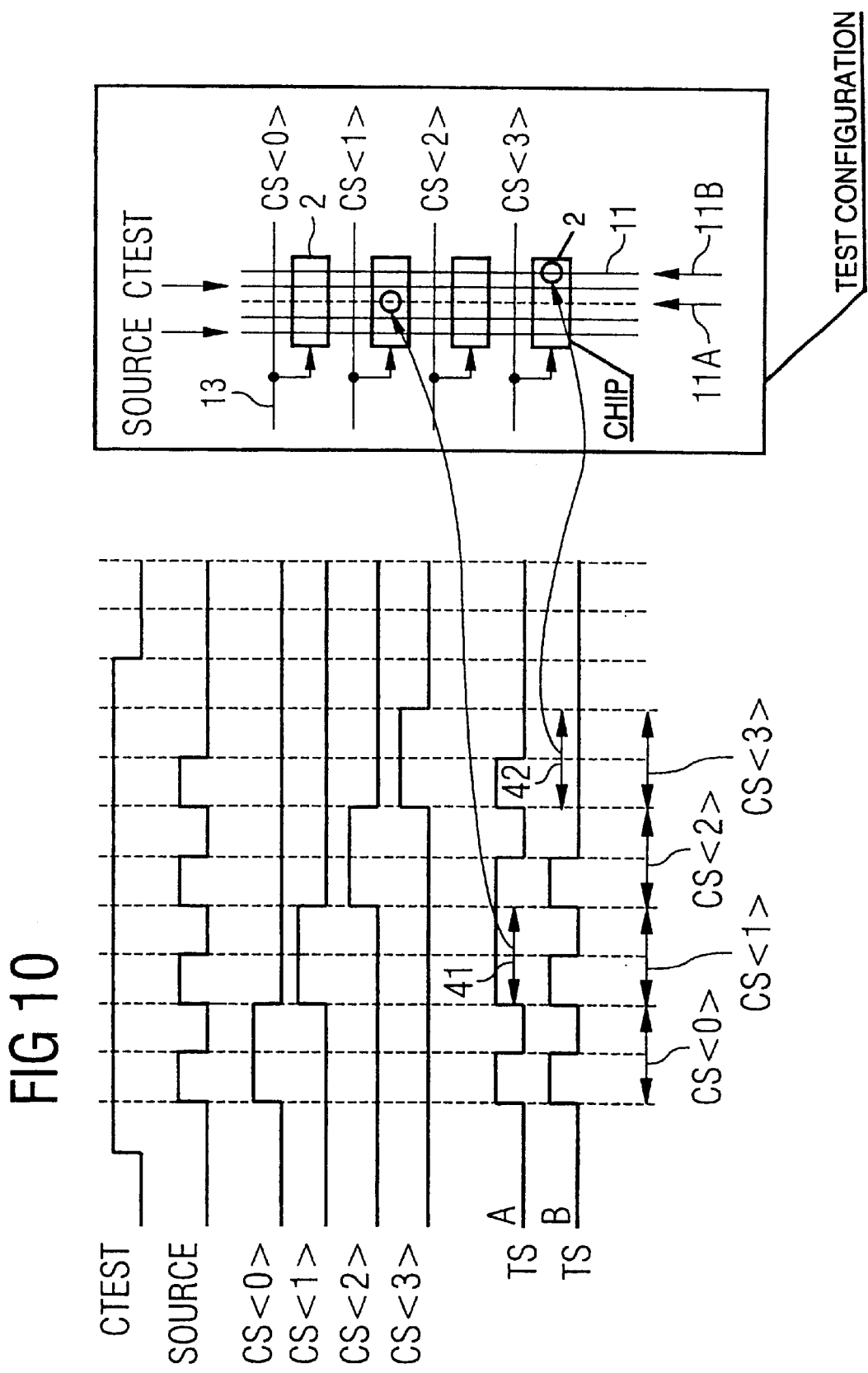

METHOD FOR CHECKING A CONDUCTIVE CONNECTION BETWEEN CONTACT POINTS

BACKGROUND OF THE INVENTION

Field of the Invention

The invention relates to a method for checking a conductive connection between contact points of semiconductor chips formed on a wafer and mating contacts of a test head.

Methods are already known by which the electrically conductive connection between the contact pins of a test head and the contact points of the semiconductor chips formed on a wafer can be checked. The test head usually extends over a group of 4 to 64 semiconductor chips. If 64 semiconductor chips are intended to be tested in parallel and each of the semiconductor chips has 60 contact points, it is necessary to check 3840 connections between the contact pins of the test head and the contact points of the semiconductor chips. In conventional methods, a negative voltage is applied to the contact points of the semiconductor chips. Internally, the contact points of the semiconductor chips are connected to a respective protective diode that is forward-biased in the case of a negative voltage at the contact points. The electrically conductive connection between the contact point and the respective contact pin of the test head is ascertained by the current flowing through the protective diodes and the contact points.

However, if all of the semiconductor chips on a wafer are intended to be tested simultaneously, given 500 to 1000 semiconductor chips on a wafer it is necessary to check 30,000 to 60,000 electrically conductive connections. Otherwise, even functional semiconductor chips do not pass the subsequent tests and are qualified as unusable.

The electrically conductive connection between the contact points of the semiconductor chips and the test pins of the test head cannot readily be checked by using the conventional methods.

SUMMARY OF THE INVENTION

It is accordingly an object of the invention to provide a method for checking the electrically conductive connection between a large number of contact points of a wafer and the mating contacts of a test head.

With the foregoing and other objects in view there is provided, in accordance with the invention, a method for checking a conductive connection between contact points of semiconductor chips formed on a wafer and mating contacts of a test head. The method includes steps of: connecting functionally identical contact points of the semiconductor chips in columns using column lines configured in the test head; outputting test signals, which are temporally offset, in rows from the semiconductor chips to the column lines; and detecting and evaluating the test signals, which are temporally offset, from the column lines.

In accordance with an added feature of the invention, the method includes steps of: initially, connecting the contact points of the semiconductor chips to shift registers; and connecting the contact points in rows to a respective selection signal line.

In accordance with an additional feature of the invention, the method includes steps of: generating a test bit in each first storage cell of the shift registers by resetting the shift registers; applying a selection signal having a beginning that is temporally offset by rows; and shifting each test bit row by row to outputs of the shift registers, such that when each test bit arrives at the outputs of the shift registers, test signals are output to the column lines using driver circuits.

In accordance with another feature of the invention, the method includes steps of: placing the contact points in a high-impedance state if no test signal is present at the contact points.

In accordance with a further feature of the invention, the method includes steps of: connecting the contact points to a test signal line; and applying a test signal to the test signal line, and feeding the test signal in rows, one after another, to the column lines.

In accordance with a further added feature of the invention, the method includes steps of: using switching elements to connect rows of the contact points of the semiconductor chips to a plurality of test signal lines; and activating the switching elements using a respective selection contact point of the semiconductor chips.

In accordance with a further additional feature of the invention, the method includes using some of the column lines as the test signal lines.

In the inventive method, the electrically conductive connection between the contact points and the mating contacts of the test head is tested sequentially row by row. It suffices, therefore, for the test signals running on the column lines to be detected and evaluated. Therefore, only one evaluation circuit per column line is required for carrying out the method. Therefore, the technical outlay for carrying out the method is kept within acceptable limits.

In a preferred embodiment of the invention, the contact points of the semiconductor chips are connected to shift registers, that are connected row by row to switching signal lines. By applying switching signals to the switching signal lines, test bits in the shift registers are shifted row by row in a temporally offset manner to the output of the shift registers. Upon the application of a test bit, a test signal is output to the column lines using a driver circuit. In this refinement of the method, only two additional contact points for feeding in the switching signal and for resetting the shift registers are required at the semiconductor chips. This method can then be used to test all of the remaining contact points of the semiconductor chips independently of their function.

In a further preferred embodiment of the invention, the contact points are connected to test signal lines via which a test signal is subsequently fed row by row one after the other into the column lines.

In order to connect the contact points to the internal test signal line and in order to feed the test signals into the test signal line, at least three contact points are required.

In return, however, the shift registers assigned to the contact points can be dispensed with.

Other features which are considered as characteristic for the invention are set forth in the appended claims.

Although the invention is illustrated and described herein as embodied in a method for checking a conductive connection between contact points, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 6 shows the temporal sequence of the signals of the test method and the relationship between a defective contact and the test signals generated using the circuit shown in FIG. 5;

FIG. 7 illustrates the states of the shift register of the circuit shown in FIG. 5 during the performance of the test method;

FIG. 8 shows a modified exemplary embodiment of the circuit shown in FIG. 5;

FIG. 9 shows a block diagram of a further circuit arrangement in a semiconductor chip; and FIG. 10 is a diagram showing the temporal sequence of the signals of the method when carried out using the circuit shown in FIG. 9.

DESCRIPTION OF THE PREFERRED EMBODIMENTS

Figure 1A:
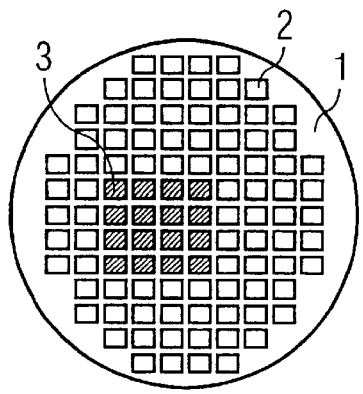
FIG. 1A is a plan view of a prior art wafer with the test region marked.
Figure 2A:
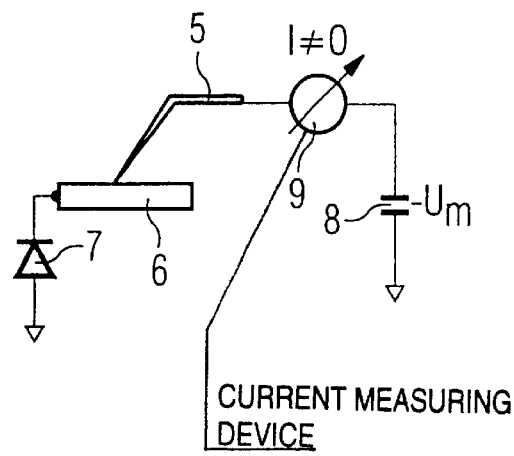
FIGS. 2A to 2B show an illustration of a prior art method for checking a conductive connection between the contact points of the wafer and the contact pins of the test head.

Referring now to the figures of the drawing in detail and first, particularly, to FIG. 1A thereof, there is shown a plan view of a wafer 1, on which semiconductor chips 2 are formed. The semiconductor chips 2 may be, for example, memory modules. The semiconductor chips 2 have not yet been separated, but rather are still situated in the wafer composite. In the prior art, groups 3 of the semiconductor chips 2 are tested using a test head 4. The group 3 of the semiconductor chips 2 covered by the test head 4 is marked in FIG. 1A. In this case, the functionality of the semiconductor chips 2 is checked. The groups 3 of the semiconductor chips tested by the known method include from 2×2 to 8×8 semiconductor chips 2. Contact between the semiconductor chips 2 on the wafer 1 and the test head 4 is produced by the mating contacts 5 of a test head 4. The mating contacts are usually needles which, as illustrated in FIG. 2A, bear on contact points 6 of the semiconductor chips 2. In the prior art, the conductive connection between the contact points 6 and the mating contacts 5 is checked using a respective protective diode 7 that is connected to a contact point 6. This diode is forward-biased when a negative external voltage—$U_m$ is applied. The negative external voltage is applied via an external voltage source 8. A current measuring device 9 is required for detecting the current flowing through the protective diode 7 and the contact point 6.

Figure 2B:
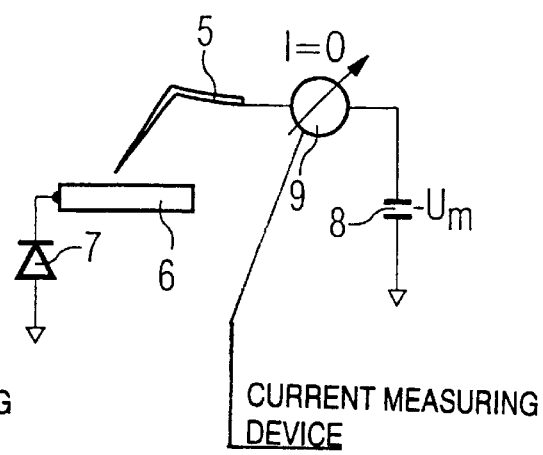

If there is no contact between the contact point 6 and the mating contact 5, no current flows through the protective diode 7 and the contact point 5 and the current measuring device 9 indicates a current intensity equal to zero (FIG. 2B). The conventional method is suitable only when a small number of connections will be checked between the mating contacts 5 and the contact points 6.

If each of the semiconductor chips 2 has about 60 contact points 6, it is necessary to check 3840 connections if 64 semiconductor chips 2 are intended to be checked simultaneously. These are typical numbers for a conventional test. In principle, as many chips as desired can be taken into account on a probe card.

There is a need, however, to test the total number of semiconductor chips 2 of the wafer 1 simultaneously. Since between 500 and 1000 semiconductor chips 2 are typically formed on a wafer 1, it is necessary to check 30,000 to 60,000 connections between a test head 10 and the wafer 1 (See FIG. 3B).

Figure 3A:
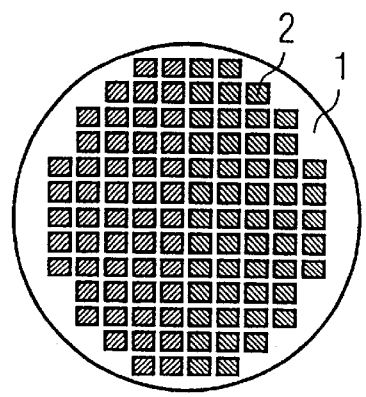
FIG. 3A is a plan view of a wafer tested by an inventive method.
Figure 1B:
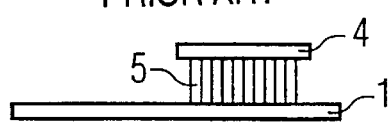
FIG. 1B is a side view of the prior art wafer.
Figure 3B:
FIG. 3B is a side view of the wafer tested by an inventive method.

Accordingly, all of the semiconductor chips 2 are marked as semiconductor chips 2 that will be tested in FIG. 3A.

Figure 4:
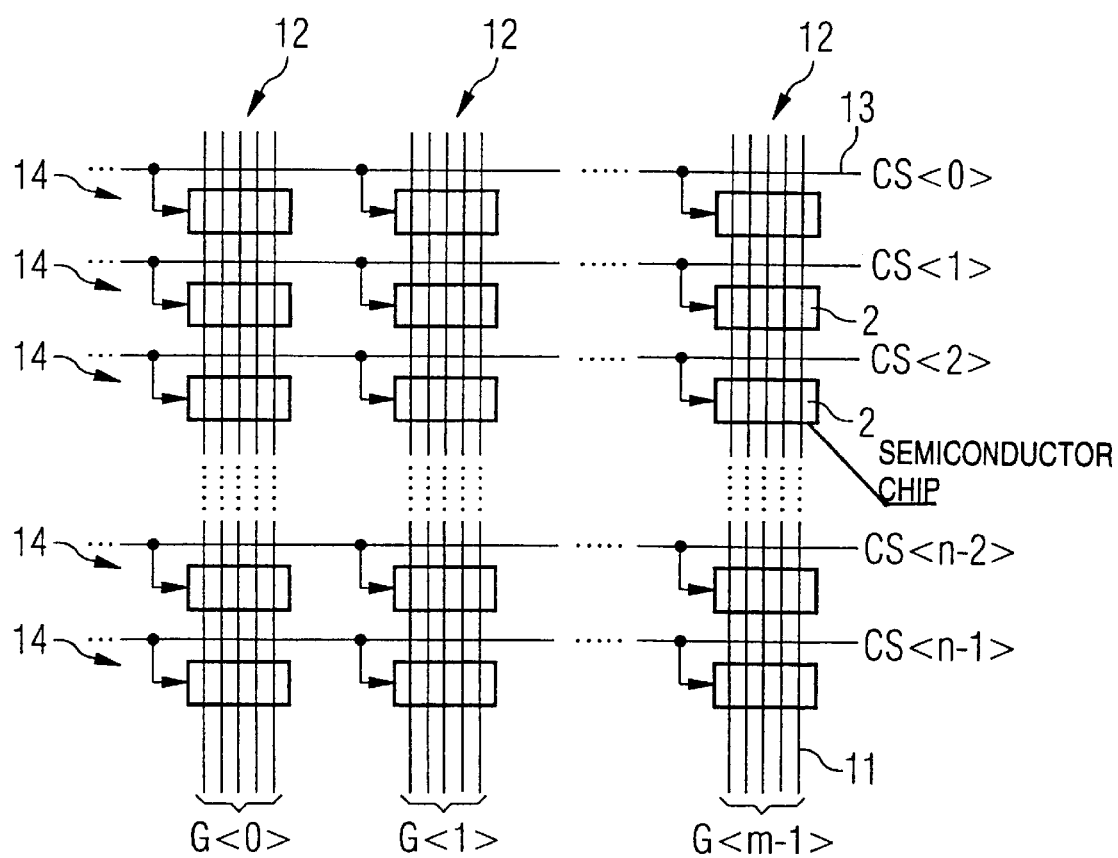
FIG. 4 is a basic circuit diagram of a circuit used for carrying out the inventive method in the test head.

In accordance with FIG. 4, in the test head 10, functionally identical contact points 6 of the various semiconductor chips 2 are in each case electrically conductively connected by column lines 11, and as a result, the semiconductor chips lying in columns 12 are in each case combined to form groups G<0> to G<m−1>.

Moreover, the semiconductor chips 2 are connected row by row to selection signal lines 13, which are designated by CS<0> to CS<n−1> in FIG. 4. Using the selection signal lines 13, the semiconductor chips 2 in the respective row 14 can be made to output a test signal on the column lines 11. The test signals are output to the column lines row by row in a temporally offset manner, so that the test signals running on the column lines 11 can be assigned to the individual rows 14. This method makes it possible to check even a large number of connections between the contact points 6 of the semiconductor chips 2 and the mating contacts 5 of the test head 4 without requiring a disproportionately large outlay, since the contact points 6 can be rapidly switched through row by row, and the read-out of the column lines 11 requires only as many read devices as there are column lines 11 present.

Figure 5:
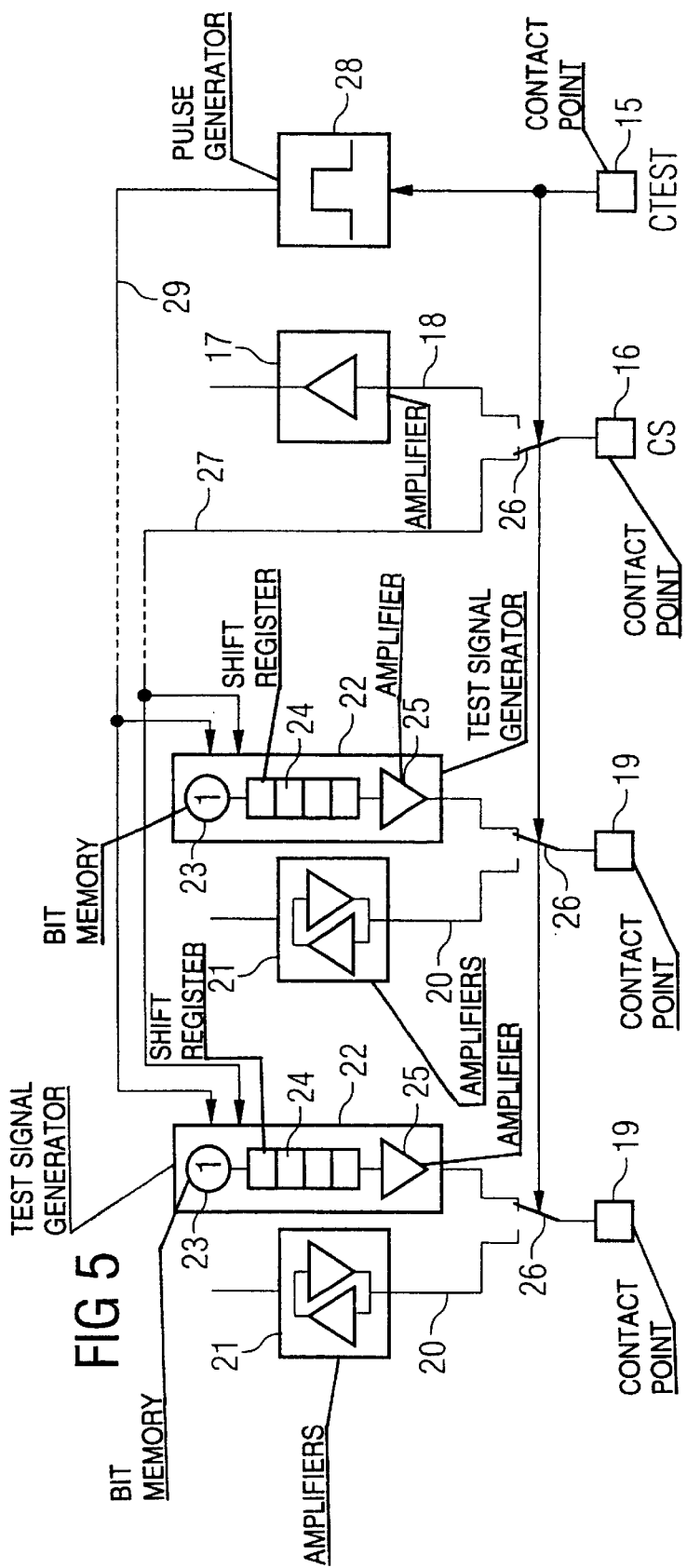
FIG. 5 is a block diagram of a circuit with shift registers configured in the semiconductor chip.

FIG. 5 illustrates a block diagram of a circuit arrangement in the semiconductor chip 2 that can be tested using the method described above. The semiconductor chip illustrated in FIG. 5 has a changeover contact point 15 suitable for inputting a changeover signal CTEST. By applying the changeover signal to the changeover contact point 15, a selection contact point 16 is isolated from a control, address, or command line 18 leading to an input amplifier 17. At the same time, data contact points 19 are isolated from data lines 20 leading to input and output amplifiers 21. In this case, the data contact points 19 are connected to a test signal generator 22. The test signal generator 22 in each case includes a test bit memory 23, downstream of which a shift register 24 is connected. An amplifier 25 is connected to the output of the shift register 24. The shift registers 24 must have the same number of storage cells as the number of rows 14 present.

At the beginning of the test method, a changeover signal is applied to the changeover contact point 15. As a result, the switch 26 changes over the data contact points 19 from the data lines 20 to the test signal generators 22. Moreover, the selection contact point 16 is changed over from the control and address line 18 to a switching signal line 27. Furthermore, the changeover signal triggers a pulse generator 28, which resets the test signal generators 22 into the basic state. In this case, the test bit stored in the test bit memory 23 is accepted into a first storage cell of the shift registers 24 and the content of the remaining storage cells of the shift registers 24 is cleared. The signal for resetting the test signal generators 22 is output via a reset line 29 from the pulse generator 28 to the test signal generators 22.

Afterward, a selection signal is fed via the selection contact point 16 into the semiconductor chip 2, where it clocks the test signal generators 22. As a result, the test bit is shifted step by step through the storage cells of the shift register 24. When the test bit appears at the output of the shift register 24, the amplifier 25 outputs a test signal to the column lines 11.

FIG. 6 illustrates the temporal sequence of the test method. At the very top there is an illustration of the temporal profile of the changeover signal CTEST. Illustrated underneath is the temporal profile of the selection signals CS that are assigned to the respective rows 14 and that are fed into the semiconductor chips 2 via the selection signal lines 13 and the selection contact point 16. During a start phase 30, a selection signal is fed row by row one after the other into the selection signal lines 13. In the exemplary embodiment illustrated in FIG. 6, the beginning of the selection signal is delayed by a clock period in each case from row to row. After n−1 clock periods, in the row 14 to which the clock signal CS<0> is applied, the test bit is present at the amplifier 25, so that the test signal is output to the column lines 11.

In FIG. 6, the temporal profile of the test signals on the column lines 11 is depicted by way of example using two column lines 11A and 11B of the test configuration 62. If there is an entirely satisfactory electrical connection between the data contact points 19 and the mating contacts 5 in all of the rows 14, a respective test signal TS in the characteristic form must be present on the column lines 11 during a test phase 31. A failure 32 in the test signal TS-B indicates, for example, a defective contact 60 in the column line 11B in the row 14 to which the switching signal CS<1> is applied.

It shall be noted that short circuits to a voltage supply can also be discerned from the test signal TS. In this case, the test signal TS would remain continuously at the same voltage level.

It shall furthermore be noted that a poor contact between the selection contact point 16 and the corresponding mating contact 5 of the test head 4 can likewise be ascertained by a constant voltage level on the column lines 11.

FIG. 7 again illustrates the shift registers 24 of successive rows 14. By virtue of the row by row delayed beginning of the switching signals CS<0> to CS<3> during the start phase 30, the test bit, which is shown in FIG. 7 as a logic "1" (identified by the hatched storage cell of the storage register 24, is situated in each case in a different storage cell of the shift register 24 in successive rows 14. Therefore, the test bit appears at the output of the shift register 24 at a time characteristic of the respective row 14. As a result of the appearance of the test bit at the output of the shift register 24, however, the test signal TS is generated for the column lines 11. Therefore, the quality of the electrical connection between the data contact points 19 and the mating contacts 5 can be inferred from the temporal profile of the test signals TS.

FIG. 8 illustrates a modified shift register 33 which can be used to generate high-impedance states at the data contact points 19. This shift register 33 has two subregisters SR1 and SR2, in which, in each case offset by one storage cell, two test bits "1" from the selection signal CS are shifted through the storage cells of the shift register 33. The outputs of the subregisters SR1 and SR2 are respectively connected to inputs of an amplifier circuit 34, which switches the output into the high-impedance state ("tristate") whenever a logic "0" is present at both inputs.

The amplifier circuit 34 is extracted and shown as an enlarged inset in FIG. 8. The amplifier circuit 34 includes a push-pull output stage formed by an n-channel transistor 35 and a p-channel transistor. The n-channel transistor 35 is connected to ground at the source end and the p-channel transistor 36 is connected to $V_{int}$ at the source end. An inverter 37 is connected upstream of the gate of the p-channel transistor 36. During the advancing of the subregisters SR1 and SR2 of the shift register 33, first the logic "1" appears at the output of the shift register SR1, which leads to a logic "1" at the output of the amplifier circuit 34. At the next switching cycle, the subregister SR1 switches to back to "0" and the logic "1" now appears at the output of the subregister SR2. The amplifier circuit 34 then switches to a logic "0" at the output. At all other times, a logic "0" is present at both inputs of the amplifier circuits 34, which puts the amplifier circuit 34 into the high-impedance state.

FIG. 9 illustrates a further embodiment of a semiconductor chip 2 that is likewise provided with a changeover contact point 15 and a selection contact point 16. In addition to the data contact points 19, an address contact point 38 is also depicted in FIG. 9, and is also present in the exemplary embodiment of the semiconductor chip 2 as illustrated in FIG. 55.

By applying a changeover signal to the changeover contact point 15, the data contact points 19 and also the switching contact point 16 and the address contact point 38 are isolate from internal data lines 20 and control and address lines 18. In this case, the selection contact point 16 is changed over to the internal selection signal line 27. By contrast, the data contact points 19 and the address contact points 38 are changed over to an internal test signal line 39. The data contact points 19 and the address contact points 38 can be electrically conductively connected internally by the test signal lines 39 by the switches 40 which are arranged in the test signal line 39 and are actuated by the selection signals running on the selection signal line 27. A test signal fed into one of the data contact points 19 or the address contact points 38 therefore appears at all the remaining data contact points 19 or address contact points 38.

FIG. 10 illustrates the temporal sequence of the test method on the basis of the internal circuit in the semiconductor chip 2 as illustrated in FIG. 9. At the beginning, the changeover signal CTEST is applied to the changeover contact point 15. As a result, the data contact points 19 and the address contact points 38 are isolated from the internal data lines 20 and the control and address lines 18 and are changed over to the test signal line 39. A test signal "source" is subsequently applied to one of the column lines 11. The selection of the rows 14 of the semiconductor chips 2 is performed by the external selection signal lines 13, which are connected to the selection contact point 16. The switching signals are designated row by row by CS<0> to CS<3> in FIG. 10.

As a result of the selection signals CS<0> to CS<n−1> being applied row by row in a temporally offset manner, the test signals TS appear in temporal succession on the column lines 11 that are not used for feeding in the test signal "source" The profile of these test signals TS corresponds to the section of the test signal "source", which is selected by the selection signals CS<0> to CS<n−1>.

FIG. 10 illustrates the profile of the test signal TS in two column lines 11A and 11B. These test signals are designated as TS A and TS B below. The test signal TS A has a failure 41 at the instant at which the selection signal CS<1> is activated, since, during this time, the test signal source has a switching operation which cannot be found in the test signal TS A. Rather, the test signal TS A remains at a high voltage level. This indicates a short circuit of the assigned contact point 19 to a voltage supply.

A second failure 42 in the test signal TS B at the instant of the activation of the selection signal CS<3> is distinguished by the fact that the test signal TS B remains at zero during this time even though the test signal "source" has a high voltage level. This indicates a lack of an electrically conductive connection between the data contact point 19 and the associated mating contact 5 of the test head 4.

The method described with reference to FIGS. 9 and 10 is distinguished by the fact that only a small additional outlay on circuitry is required within the semiconductor chip 2. In particular, there is no need for test signal generators as in the exemplary embodiment illustrated with reference to FIGS. 5 and 6. Rather, the test signal is fed externally into the semiconductor chip 2. However, that requires an additional input through which the test signal "source" is fed into the semiconductor chip 2.

I claim:

1. A method for checking a conductive connection between contact points of semiconductor chips formed on a wafer and mating contacts of a test head, the method which comprises:

connecting functionally identical contact points of the semiconductor chips in columns using column lines configured in the test head;

outputting test signals, which are temporally offset, in rows from the semiconductor chips to the column lines; and detecting and evaluating the test signals, which are temporally offset, from the column lines.

2. The method according to claim 1, which comprises:

initially, connecting the contact points of the semiconductor chips to shift registers; and connecting the contact points in rows to a respective selection signal line.

3. The method according to claim 2, which comprises:

generating a test bit in each first storage cell of the shift registers by resetting the shift registers;

applying a selection signal having a beginning that is temporally offset by rows; and shifting each said test bit row by row to outputs of the shift registers, such that when each said test bit arrives at the outputs of the shift registers, test signals are output to the column lines using driver circuits.

4. The method according to claim 1, which comprises:

placing the contact points in a high-impedance state if no test signal is present at the contact points.

5. The method according to claim 1, which comprises:

connecting the contact points to a test signal line; and applying a test signal to the test signal line, and feeding the test signal in rows, one after another, to the column lines.

6. The method according to claim 5, which comprises:

using switching elements to connect rows of the contact points of the semiconductor chips to a plurality of test signal lines; and activating the switching elements using a respective selection contact point of the semiconductor chips.

7. The method according to claim 6, which comprises using some of the column lines as the test signal lines.

8. The method according to claim 5, which comprises using one of the column lines as the test signal line.

* * * * *